(12) United States Patent
Taine et al.

(10) Patent No.: US 12,439,827 B2
(45) Date of Patent: Oct. 7, 2025

(54) METHOD FOR MANUFACTURING AN ELECTROACTIVE POLYMER DEVICE

(71) Applicant: SINGLE BUOY MOORINGS INC., Marly (CH)

(72) Inventors: Emmanuel Taine, Monaco (MC); Phillipe Jean, Monaco (MC); Regis Boulard, Monaco (MC)

(73) Assignee: SINGLE BUOY MOORINGS INC., Marly (CH)

( * ) Notice: Subject to any disclaimer, the term of this patent is extended or adjusted under 35 U.S.C. 154(b) by 1188 days.

(21) Appl. No.: 17/279,970

(22) PCT Filed: Sep. 25, 2019

(86) PCT No.: PCT/EP2019/075930
§ 371 (c)(1),
(2) Date: Mar. 25, 2021

(87) PCT Pub. No.: WO2020/064872
PCT Pub. Date: Apr. 2, 2020

(65) Prior Publication Data
US 2021/0391527 A1   Dec. 16, 2021

(30) Foreign Application Priority Data
Sep. 26, 2018   (EP) ..................... 18306262

(51) Int. Cl.
*H01F 7/06*   (2006.01)
*H10N 30/057*   (2023.01)
(Continued)

(52) U.S. Cl.
CPC ......... *H10N 30/871* (2023.02); *H10N 30/057* (2023.02); *H10N 30/067* (2023.02); *H10N 30/098* (2023.02)

(58) Field of Classification Search
CPC .... H10N 30/057; H10N 30/06; H10N 30/067; H10N 30/098; H10N 30/871
See application file for complete search history.

(56) References Cited

U.S. PATENT DOCUMENTS 10,749,448 B2 * 8/2020 Lindsay ............... H10N 30/852
11,256,331 B1 * 2/2022 Diest ..................... G06F 3/0447
(Continued)

FOREIGN PATENT DOCUMENTS

WO   2010/146457   12/2010

OTHER PUBLICATIONS

International Search Report for PCT/EP2019/075930 dated Nov. 28, 2019, 3 pages.
(Continued)

*Primary Examiner* — Paul D Kim
(74) *Attorney, Agent, or Firm* — NIXON & VANDERHYE

(57) ABSTRACT

A method for manufacturing an electroactive polymer device which includes a layered structure including a dielectric polymer layer and an electrode layer, wherein the electrode layer is arranged on a surface of the dielectric polymer layer. The method includes: providing the dielectric polymer layer; determining a surface area location of a defect on a first surface of the dielectric polymer layer; creating an electrode layer including an area void of electrode layer material surrounding the surface area location, and the electrode layer includes a patch of electrode material covering the surface area location and a remainder part of the surface of the dielectric polymer layer surrounding the area void of electrode layer material, in which the patch and the remainder part are electrically isolated from one another.

17 Claims, 3 Drawing Sheets

(51) Int. Cl.
*H10N 30/067* (2023.01)
*H10N 30/098* (2023.01)
*H10N 30/87* (2023.01)

(56) References Cited

U.S. PATENT DOCUMENTS

2005/0085693 A1* 4/2005 Belson ................ A61B 1/0053
　　　　　　　　　　　　　　　　　　　　　600/114
2008/0191585 A1　 8/2008 Pelrine et al.

OTHER PUBLICATIONS

Written Opinion of the ISA for PCT/EP2019/075930 dated Nov. 28, 2019, 4 pages.

* cited by examiner

METHOD FOR MANUFACTURING AN ELECTROACTIVE POLYMER DEVICE

CROSS-REFERENCE TO RELATED APPLICATIONS

This application is the U.S. national phase of International Application No. PCT/EP2019/075930 filed Sep. 25, 2019 which designated the U.S. and claims priority to EP 18306262.9 filed Sep. 26, 2018, the entire contents of each of which are hereby incorporated by reference.

TECHNICAL FIELD

The invention relates to a method for manufacturing an electroactive polymer device. The invention also relates to an electroactive polymer device and to an adhesive sticker for use in the method.

BACKGROUND ART

Energy conversion systems that convert mechanical energy into electrical energy are commonly used nowadays. An example of such systems is a dielectric electroactive polymer (DEAP) based device, which is disclosed in WO2010/146457.

Such a DEAP-based device or DEAP device comprises a dielectric elastomer carrier layer. Electrode layers are arranged on the surfaces of the dielectric elastomer layer. The DEAP device can be considered as a variable capacitor of which the capacitance changes as a function of the amount of deformation exerted on a layer of DEAP material. Due to an external force the electroactive polymer material can be stretched i.e., elastically deformed, which causes a decrease in the distance between the electrode layers. The distance increases again when the external force diminishes and the electroactive polymer layer relaxes. By applying electrical charge on the capacitor at substantially the maximum deformation and removing the electrical charge at minimal deformation, energy can be harvested from the DEAP device. Alternatively, by adjusting the electrical charge on the capacitor the mechanical properties of the capacitor can be controlled.

Increasing the electrical field in DEAP devices is of high importance because of its quadratic contribution to the amount of electrical energy that can be harvested. The density of harvested energy per amount of material will ultimately drive commercial applications.

The maximum electrical field applicable to DEAP devices in operation is generally governed by the intrinsic performance of the material (dielectric breakdown strength), the control of the manufacturing process and cleanliness (air bubbles or particles would significantly reduce the dielectric breakdown strength), the volume of material exposed to the electrical field, electrical ageing, and electrical field enhancement at specific locations.

All these parameters affect the maximum electric field of the DEAP devices. Generally, it is desirable to provide a method for manufacturing DEAP devices which allows for increased electric fields and/or improves the manufacturing efficiency and/or provides an alternative to conventional methods.

SUMMARY OF THE INVENTION

According to an aspect of the invention, there is provided a method for manufacturing an electroactive polymer device which comprises a layered structure comprising a dielectric polymer layer and an electrode layer, wherein the electrode layer is arranged on a surface of the dielectric polymer layer; the method comprising: providing the dielectric polymer layer; determining a surface area location of a defect on a first surface of the dielectric polymer layer; creating an electrode layer comprising an area void of electrode layer material surrounding the surface area location; wherein the electrode layer comprises a patch of electrode material covering the surface area location and a remainder part of the surface of the dielectric polymer layer surrounding the area void of electrode layer material, wherein the patch and the remainder part are electrically isolated from one another.

The present method allows for removing all weak points in the dielectric polymer layer from exposure to electrical field. In this way, electric breakdowns during use of the DEAP device are prevented. The method also ensures a stable mechanical performance in the event of repeated stretching, which is a notable feature of such DEAP devices. In other words, tearing of the dielectric polymer layer is prevented. More importantly, the process reduces the volume dependency of the dielectric failure probability. The removal of volume dependency is a major improvement for large DEAP generators containing thousands of square meters of DEAP films. The method allows for a much higher operating electrical field and therefore significantly increases the energy production. A three-fold increase in energy output may be expected in typical DEAP devices when the present method is applied.

When large volumes of material are required, the operational electric field is significantly reduced. The reduction of the field is attributed to a higher defect probability in large volumes of material. The reduction of electrical field is intrinsically related to the purity of the film. By assuring that locations of defects are not subjected to the electric field, the electric field can thus be increased, and the failure probability is no longer volume dependent.

The construction of the patch on top of the surface area location repairs the pinhole or defect at both sides of the dielectric polymer layer, and ensures stable mechanical performance, i.e. such that the pinhole does not propagate into a crack. The structure thus combines the functionalities of electrical insulation and reparation of the defect. The patch is preferably circular. The area void of electrode layer material preferably has an annular shape.

Preferably, the dielectric polymer layer is an elastomer layer, wherein the elastomer may be a polymer selected from a group comprising a silicone polymer, a polyurethane, a urethane polymer and an acrylic polymer.

The dielectric polymer layer preferably has a thickness of 10 to 100 microns, while the electrode layer preferably has a thickness of about a few nanometres to less than 100 microns. In an embodiment, the layered structure consists of the dielectric polymer layer and at least one electrode layer.

The area void of electrode layer may be covered or filled with dielectric polymer such that it electrically isolates the patch of electrode layer material from the remainder part.

In an embodiment, the step of creating an electrode layer comprises: forming a patterned area layer on a portion of the surface of the dielectric polymer layer surrounding the surface area location, while leaving the surface area location and a remainder of the surface of the dielectric polymer layer exposed; depositing electrode layer material over at least the surface area location and the remainder of the surface of the dielectric polymer layer; removing the patterned area layer to create the electrode layer comprising an area void of electrode layer material around the surface area location.

This embodiment has the advantage that the area void of electrode layer material is consistent and reliable, and has a negligible probability of unintentional electrode material deposition in the area void of electrode.

In an embodiment, the method further comprises curing the electrode layer after the removal of the patterned area layer. The curing step after the removal of the patterned area layer increases the durability of the electrode layer while making sure that the patterned area layer can be removed easily.

In an embodiment, the patterned area layer is selected from an adhesive sticker and a printed masking layer. The sticker and printed masking layer are functionally convenient ways to apply a patterned area.

In this regard, the patterned area layer should be construed as a local mask with a predefined shape that is positioned around the location of the defect in the dielectric polymer layer.

A person skilled in the art will understand that there are several alternatives available for the adhesive sticker or the printed masking layer, such as a surface treatment preventing wetting or curing of the electrode material at specific locations; or a chemical deposition preventing wetting or curing of the electrode material at specific locations; or an electrode deposition process precise enough to get the desired geometry (precise spraying or printing).

In an embodiment, the step of creating the electrode layer as described above comprises printing the electrode layer. The electrode layer can also be directly printed, such that an area void of electrode layer is surrounding the surface area location, while the surface area location itself is covered with a patch of electrode. Printing of the electrode layer can be done in many ways known in the art.

In an embodiment, the patterned area layer as described above has an annular shape, and the patterned area layer is arranged centred around the surface area location. The annular shape is advantageous, since the patterned area layer does not have any sharp corners which may cause local electric field enhancement. In an embodiment, the method further comprises curing the electrode layer after the step of printing. The curing step after the printing increases the durability of the electrode layer.

In an embodiment, the method comprises a step of filling the area void of electrode layer material with dielectric polymer material. The dielectric polymer will be able to isolate the defect from the surrounding electrode layer.

In an embodiment, the defect is an electric breakdown defect, and the method as described above comprises the step of determining the surface area location of the electric breakdown defect comprises: providing a conductive substrate; arranging the dielectric polymer layer with a second surface opposite the first surface on the conductive substrate, such that the first surface is facing away from the conductive substrate; placing a movable electrode on or above the first surface; applying a high voltage between the movable electrode and the conductive substrate; moving the movable electrode over the first surface so as to expose the first surface of the dielectric polymer layer to the applied high voltage.

The dielectric polymer layer is exposed to an electrical proof-load test before being assembled in a generator ring or stack. Hence, the material can be operated confidently as the entire layer has been tested at a high electrical field (which may be higher than the one used in operation). The testing of the entire layer allows for high reliability of the DEAP device.

The conductive substrate may be a conductive carrier web or a metalized carrier web. The conductive substrate may be for instance a carrier web made of polyethylene terephthalate (PET) which is metalized with a few nanometres of aluminium using a physical vapour deposition (PVD) process. A coating of 10-15 nm should be sufficient, leading to a sheet resistance of about 5 Ohms per square.

The movable electrode may be a moveable cylinder which is rolled over the film dielectric polymer layer. The cylinder allows the testing process to be continuous, with a limited amount of electrical energy stored in the system, since only the part of the layer below the high-voltage cylinder is tested. Preferably the movable electrode is in contact with the dielectric polymer layer while moving. In an embodiment, the movable electrode has a width of 50 cm. The conductive substrate is connected to ground. The dielectric polymer layer is discharged by two cylinders connected to ground located on each side of the high-voltage cylinder and rolling on the dielectric polymer layer.

In an embodiment, the method as described above comprises that the electric breakdown defect is locally created in the dielectric polymer layer during the exposure to the high voltage, and the method further comprises optically or electrically detecting a position of the created defect on the first surface and determining from the position of the defect the surface area location. In this way the defect can be consistently detected, reducing the probability of missing any defects. The dielectric polymer layer may be exposed several times to the high voltage in order to ensure that no defects along the same line have been missed. After each test under high voltage, the electrical breakdown defects identified may be covered with a sticker so that they are not subjected to the next high voltage test(s). As an alternative to optical or electrical detection, a person skilled in the art will understand that also mechanical detection or mechanical sensing will be possible.

In an embodiment, the method further comprises that the layered structure of the dielectric polymer layer and the electrode layer is removed from the conductive substrate. In this manner the layered structure can be used in a stack of layered structures.

In an embodiment, the creation of the electrode layer includes forming a conductive terminal in communication with the electrode layer on the dielectric polymer layer. The conductive terminal allows for applying a voltage on the electrode layer.

In an embodiment, the method further comprises forming a stack of a plurality of removed layered structures on each other, by adhering or gluing the dielectric polymer layer of one removed layered structure on the electrode layer of another removed layered structure that is adjacent in the stack. Having a plurality of layered structures on top of each other allows for a larger energy production compared to a single layered structure.

In an embodiment, a material of the electrode layer is selected from a group comprising conductive elastomer or graphene based elastic material. These materials meet the requirements for elasticity—an minimal elongation at break of 100%—and sheet resistance: maximum 5 k$\Omega$ per square. The stiffness of the electrode layer is preferably lower than the one from dielectric, i.e. $E(d).h(d) > E(e).h(e)$, where E and h are Young's modulus and thickness for the dielectric (d) and electrode (e) layers, respectively.

According to an aspect of the invention, and in accordance with the advantages and effects described herein, there is provided an electroactive polymer device comprising a plurality of dielectric polymer layers and a plurality of electrode layers, the dielectric polymer layers and the electrode layers stacked on each other in alternating order, in which at least one electrode layer is a electrode layer comprising an area void of electrode layer material around a surface area location of a defect in an adjacent dielectric polymer layer, and the surface area location of the defect is covered by an electrically isolated patch of the electrode material.

The device is adapted to operate with an electric field of over 1 V/μm (Volt per micrometre), preferably over 10 V/μm, more preferably between 50 and 200 V/μm.

According to an aspect of the invention, and in accordance with the advantages and effects described above, there is provided an adhesive sticker for use in the method described herein, the adhesive sticker comprising an annular shape with a central opening, and preferably a non-adhesive tab. The adhesive sticker is preferably between 25 and 50 mm in diameter and has a central opening of preferably between 10 mm and 20 mm. The adhesive sticker is preferably made of PET or PE (polyethylene; polyethene).

The various aspects discussed in this patent can be combined in order to provide additional advantages.

BRIEF DESCRIPTION OF DRAWINGS

Embodiments will now be described, by way of example only, with reference to the accompanying schematic drawings in which corresponding reference symbols indicate corresponding parts.

The figures are meant for illustrative purposes only, and do not serve as restriction of the scope or the protection as laid down by the claims.

DETAILED DESCRIPTION

Further advantages, features and details of the present invention will be explained in the following description of some embodiments thereof. In the description, reference is made to the attached figures.

Figure 1:
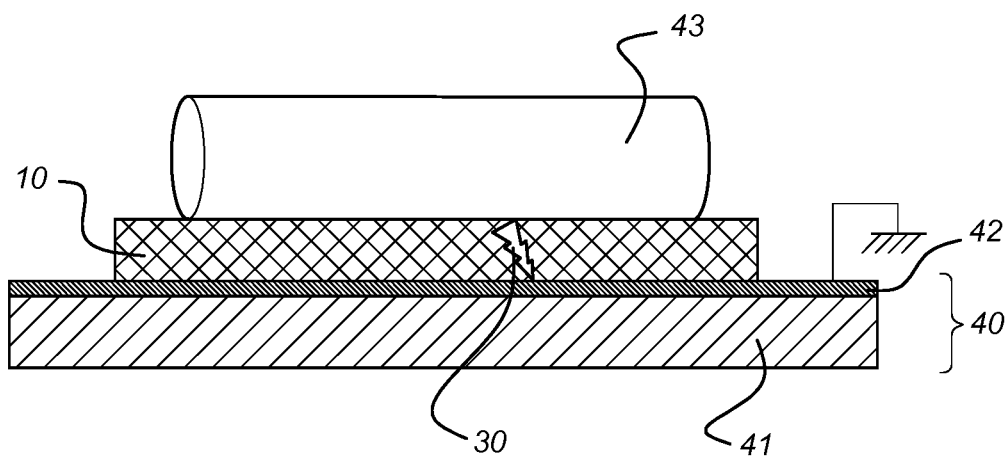
FIG. 1 shows a schematic view of an electrical proof-load testing facility as used in an embodiment.

FIG. 1 schematically shows a cross-section of a testing facility for locating any defects in a dielectric polymer (elastomer) layer 10 using an electric field. The testing facility comprises a conductive substrate 40, in this exemplary case a PET carrier web 41 with a conductive surface 42 which is formed by metallisation with a few nanometres of aluminium using physical vapour deposition. The conductive surface 42 is electrically grounded. The dielectric polymer layer 10 is arranged (e.g. coated) over the conductive surface 42. A conductive cylinder 43 which is connected to a high voltage power supply (not shown) is rolled over the dielectric polymer layer 10. In this way, a homogeneous electric field is applied across the dielectric polymer layer 10, in between the conductive surface 42 and the conductive cylinder 43. Wherever a weak point is present in the dielectric polymer layer 10, a dielectric breakdown causing a pinhole defect 30 across the thickness of the dielectric polymer layer 10 occurs. A weak point may be a small opening or thinned region in the dielectric polymer layer 10, caused by e.g. dirt, air bubbles or contamination. Pinholes caused by breakdowns are typically around 50 to 100 micrometre in diameter.

Figure 2:
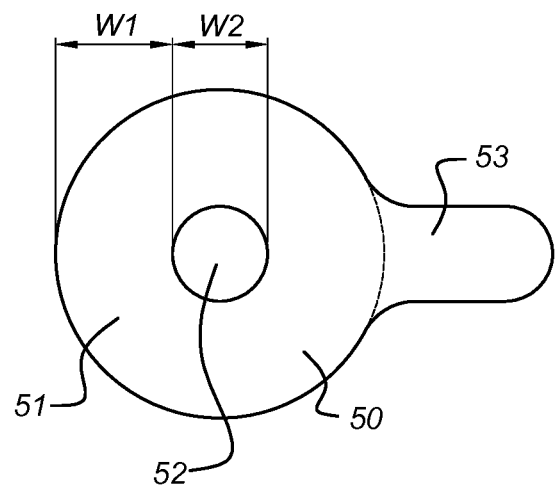
FIG. 2 shows a top view of an adhesive sticker according to an aspect of the invention.

FIG. 2 schematically shows a top view of an adhesive sticker 50 according to an aspect of the invention. The adhesive sticker 50 is adapted to be placed around a pinhole as found by the method depicted in FIG. 1. To this end, the adhesive sticker 50 comprises an annular shape 51 surrounding a central opening 52, and a non-adhesive tab 53 for easy removal. The width w1 of the annular shape 51 (at either side of the central opening 51) is preferably at least 10 mm, while the width w2 of the central opening 51 itself is preferably at least 10 mm. The diameters are chosen such that they are sufficient to electrically isolate the pinhole defect from the surroundings. The rounded edges are preferred to avoid sharp transitions leading to electric field enhancement.

Figure 3:
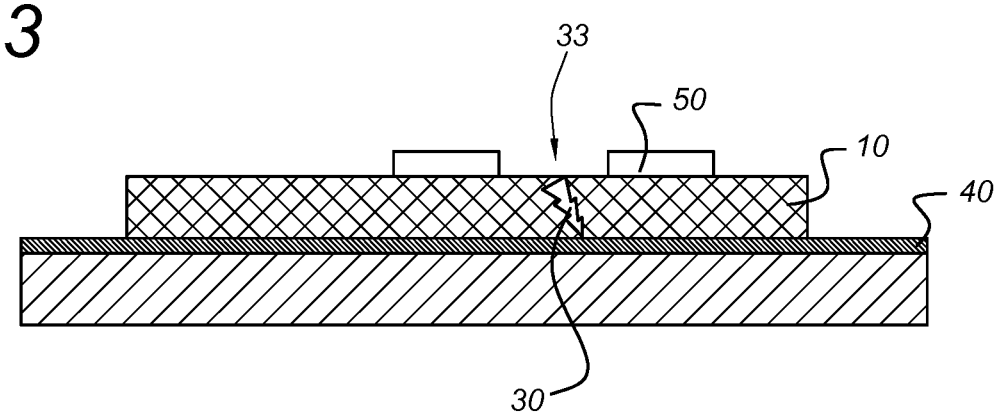
FIG. 3 shows a cross-section of a dielectric polymer layer with an adhesive sticker as manufactured by the method.

FIG. 3 schematically shows a cross-section of the dielectric polymer layer 10 of FIG. 1 on the conductive substrate 40. An adhesive sticker 50 as shown in FIG. 2 is placed on top of the dielectric polymer layer 10, centring around the pinhole defect 30. Determining the precise surface area location 33 of the pinhole defect 30 may be done for instance by high resolution cameras. Also information from the high voltage power supply and/or the moveable electrode 43, obtained during high voltage exposure of the dielectric polymer layer, may be used to determine the surface area location 33.

Figure 4:
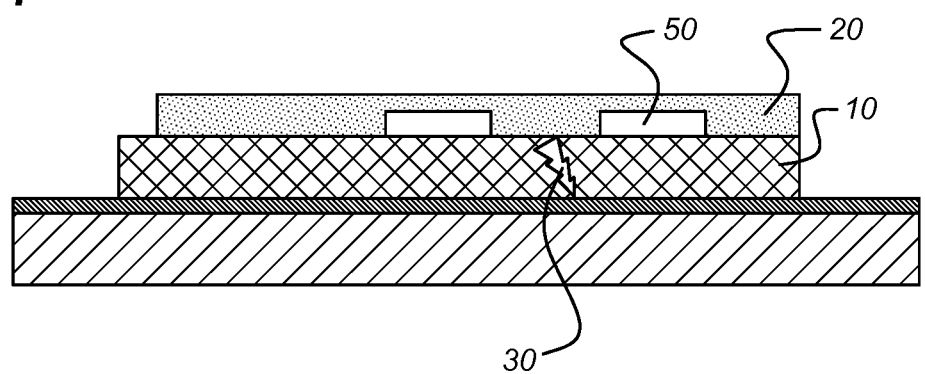
FIG. 4 shows the components of FIG. 3 with an electrode layer deposited.

FIG. 4 schematically shows the components of FIG. 3, but now the dielectric polymer layer 10 and adhesive sticker 50 are coated with an electrode layer 20, which may be a conductive elastomer. The electrode layer 20 also covers the pinhole defect 30 entirely. Some electrode material may enter the pinhole defect 30.

Figure 5:
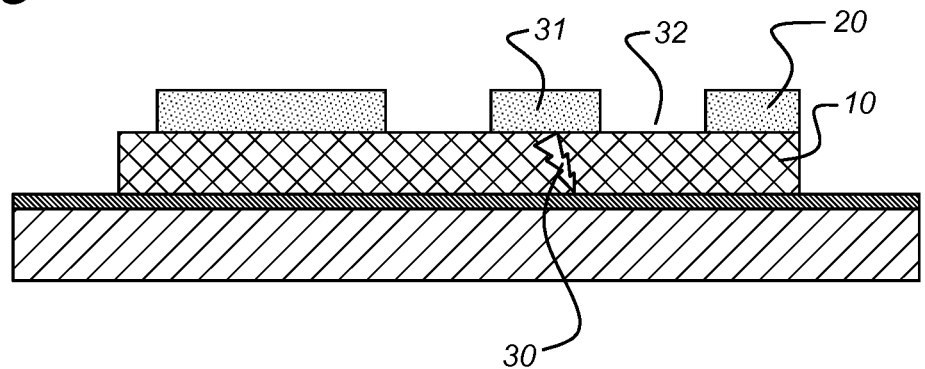
FIG. 5 shows the components of FIG. 4 with the adhesive sticker removed.

FIG. 5 schematically shows that the adhesive sticker (shown in FIG. 2) is removed, e.g. using the non-adhesive tab 53, which results in the removal of a part of the electrode layer 20. The removal results in an annular area 32, which is now void of electrode layer 20, and electrically isolates a patch 31 of electrode material on top of the defect, from the remainder of the electrode layer 20. In this way, the pinhole defect 30 in the dielectric polymer layer 10 is electrically completely isolated from the remainder of the electrode layer 20.

Figure 6:
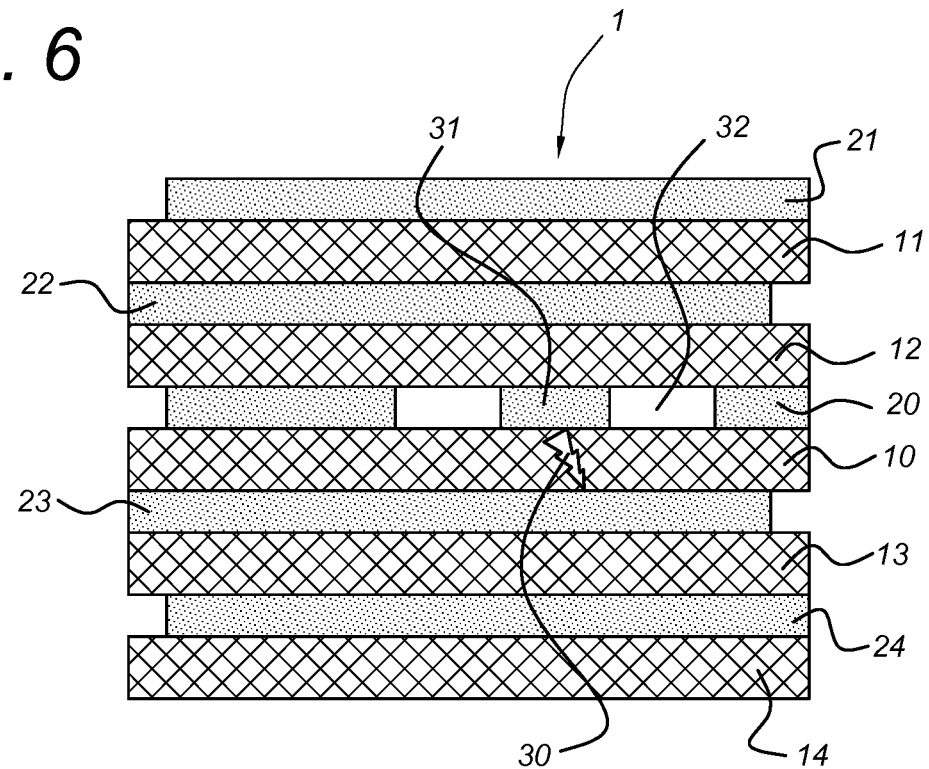
FIG. 6 shows a cross-section of a layered structure as manufactured by the method.

FIG. 6 schematically shows the structure of FIG. 5, including the dielectric polymer layer 10 with pinhole defect 30 and the electrode layer 20, embedded in a stack of other layers forming a layered structure 1. The conductive substrate of FIGS. 1-5 is peeled away. The dielectric polymer layers 11, 12, 10, 13, 14 alternate with the electrode layers 21, 22, 20, 23, 24, while the electrode layers 21, 22, 20, 23, 24 are alternatingly offset to create contacts with different polarities. The pinhole defect 30 is now glued to the electrode layer 23 at one side and to the conductive patch 31 at the other side. The gluing at both sides prevents any tearing or crack propagation originating from the pinhole defect 30, which is particularly important when the layered structure 1 is stretched repeatedly.

Figure 7:
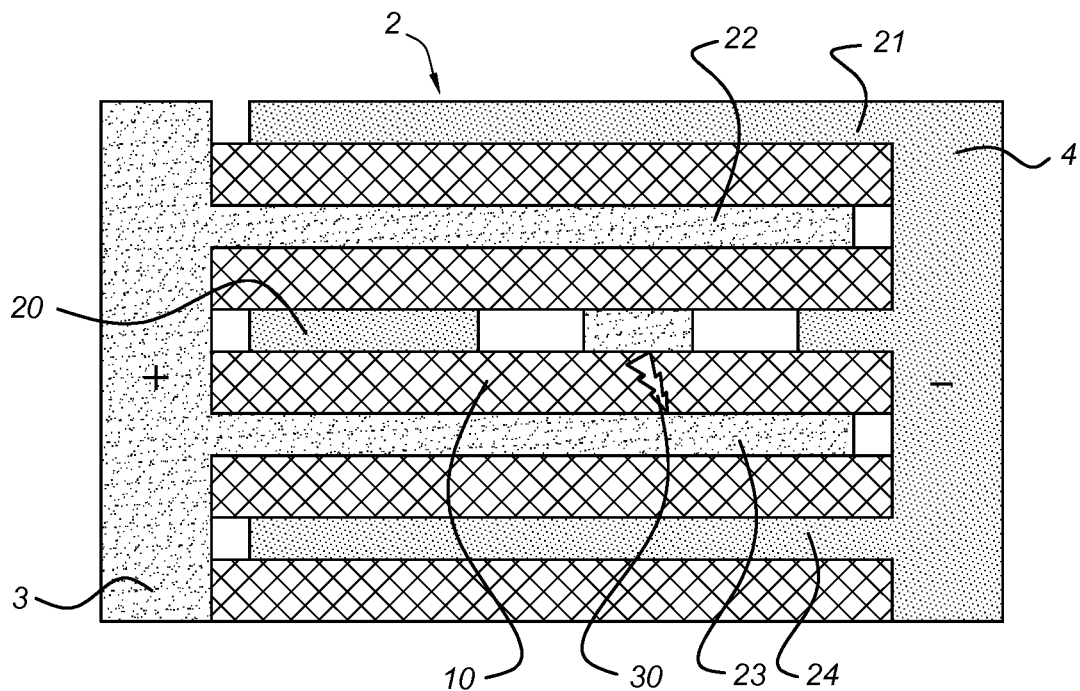
FIG. 7 shows a cross-section of an electroactive polymer device according to an aspect of the invention.

FIG. 7 shows a cross-section of an electroactive polymer device 2 which includes the layered structure 1 of FIG. 2 as well as positive and negative polarity contacts 3, 4, constructed such that the electrode layers 21, 22, 20, 23, 24 are alternately of positive and negative polarity. Notably, the pinhole defect 30 and the region of the dielectric polymer layer 10 surrounding the pinhole defect 30 are not exposed to an electric field, since the electrode material at both sides of the dielectric polymer layer 10 at the location of the pinhole defect 30 is of the same polarity. Therefore, premature dielectric failure at the location of the pinhole defect 30 is prevented.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. It will be apparent to the person skilled in the art that alternative and equivalent embodiments of the invention can be conceived and reduced to practice. All changes which come within the meaning and range of equivalency of the claims are to be embraced within their scope.

The invention claimed is:

1. A method for manufacturing an electroactive polymer device which comprises a layered structure comprising a dielectric polymer layer and an electrode layer, wherein the electrode layer is arranged on a surface of the dielectric polymer layer;
the method comprising:
providing the dielectric polymer layer;
determining a surface area location of a defect on a first surface of the dielectric polymer layer; and
creating the electrode layer comprising an area void of an electrode layer material surrounding the surface area location,
wherein the electrode layer comprises a patch of electrode material covering the surface area location and a remainder part of the first surface of the dielectric polymer layer surrounding the area void of the electrode layer material, wherein the patch of electrode material covering the surface area location and the remainder part of the first surface of the dielectric polymer layer are electrically isolated from one another.

2. The method according to claim 1, wherein the step of creating the electrode layer comprises:
forming a patterned area layer on a portion of the surface of the dielectric polymer layer surrounding the surface area location, while leaving the surface area location and a remainder of the surface of the dielectric polymer layer exposed;
depositing the electrode layer material over at least the surface area location and the remainder of the surface of the dielectric polymer layer; and
removing the patterned area layer to create the electrode layer comprising the area void of the electrode layer material around the surface area location.

3. The method according to claim 2, further comprising curing the electrode layer after the removal of the patterned area layer.

4. The method according to claim 3, wherein the patterned area layer is selected from an adhesive sticker and a printed masking layer.

5. The method according to claim 2, wherein the patterned area layer is selected from an adhesive sticker and a printed masking layer.

6. The method according to claim 2, wherein the area void of the electrode layer material has an annular shape, and is arranged centered around the surface area location.

7. The method according to claim 1, wherein the step of creating the electrode layer comprises printing the electrode layer.

8. The method according to claim 7, further comprising curing the electrode layer after the step of printing.

9. The method according to claim 1, wherein the area void of the electrode layer material has an annular shape, and is arranged centered around the surface area location.

10. The method according to claim 1, further comprising a step of filling the area void of the electrode layer material with the dielectric polymer material.

11. The method according to claim 1, wherein the defect is an electric breakdown defect, and the step of determining the surface area location of the electric breakdown defect comprises:
providing a conductive substrate;
arranging the dielectric polymer layer with a second surface opposite a first surface on the conductive substrate, such that the first surface is facing away from the conductive substrate;
placing a movable electrode on or above the first surface;
applying a high voltage between the movable electrode and the conductive substrate; and
moving the movable electrode over the first surface so as to expose the first surface of the dielectric polymer layer to the applied high voltage.

12. The method according to claim 11, wherein the electric breakdown defect is locally created in the dielectric polymer layer during the exposure of the first surface to the applied high voltage,
and the method further comprises optically or electrically detecting a position of the created electric breakdown defect on the first surface and determining the surface area location from the position of the electric breakdown defect.

13. The method according to claim 11, wherein the layered structure of the dielectric polymer layer and the electrode layer is removed from the conductive substrate.

14. The method according to claim 13, further comprising forming a stack of a plurality of removed layered structures on each other, by adhering or gluing the dielectric polymer layer of one removed layered structure on the electrode layer of another removed layered structure that is adjacent in the stack.

15. The method according to claim 1, wherein the creation of the electrode layer includes forming a conductive terminal in communication with the electrode layer on the dielectric polymer layer.

16. The method of claim 1, wherein the step of creating the electrode layer comprising the area void of the electrode layer material further comprises placing an adhesive sticker on top of the dielectric polymer layer centering around the defect.

17. The method of claim 16, wherein the adhesive sticker further comprises a non-adhesive tab.

* * * * *